United States Patent
Lee et al.

(10) Patent No.: US 7,719,897 B2
(45) Date of Patent: May 18, 2010

(54) PROGRAM VERIFICATION FOR NON-VOLATILE MEMORY

(75) Inventors: Chul-Ho Lee, Gyeonggi-do (KR); Jin-Yub Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1196 days.

(21) Appl. No.: 11/297,779

(22) Filed: Dec. 7, 2005

(65) Prior Publication Data

US 2006/0155896 A1   Jul. 13, 2006

(30) Foreign Application Priority Data

Dec. 30, 2004   (KR) .................... 10-2004-0116840

(51) Int. Cl.
  *G11C 16/26* (2006.01)
(52) U.S. Cl. ............................. 365/185.22; 365/185.13
(58) Field of Classification Search ............ 365/185.22, 365/185.09, 185.13, 189.05
  See application file for complete search history.

(56) References Cited

U.S. PATENT DOCUMENTS

| | | | |
|---|---|---|---|
| 5,299,162 A | 3/1994 | Kim et al. | |
| 5,473,563 A | 12/1995 | Suh et al. | |
| 5,696,717 A | 12/1997 | Koh | |
| 6,282,121 B1 | 8/2001 | Cho et al. | |
| 2003/0043628 A1* | 3/2003 | Lee | 365/185.17 |
| 2003/0081459 A1* | 5/2003 | Hosono et al. | 365/185.22 |
| 2003/0133340 A1* | 7/2003 | Lee | 365/200 |
| 2004/0240268 A1* | 12/2004 | Kim et al. | 365/185.09 |
| 2006/0120172 A1* | 6/2006 | Lee et al. | 365/189.05 |

FOREIGN PATENT DOCUMENTS

| | | |
|---|---|---|
| JP | 2003-249082 | 9/2003 |
| KR | 2000-27557 | 5/2000 |
| KR | 2001-0029546 | 4/2001 |

OTHER PUBLICATIONS

English language abstract of Korean Publication No. 2000-27557.
English language abstract of Korean Publication No. 2001-0029546.
English language abstract of Japanese Publication No. 2003-249082.

* cited by examiner

*Primary Examiner*—VanThu Nguyen
*Assistant Examiner*—Douglas King
(74) *Attorney, Agent, or Firm*—Myers Bigel Sibley & Sajovec, PA

(57) ABSTRACT

A non-volatile memory device includes page buffers arranged in groups, each group being coupled to a corresponding data output line so that data from more than one of the page buffers in each group may be simultaneously represented on the corresponding data output line during a program verification operation. Page buffers may be arranged in repair units with data from more than one page buffer simultaneously coupled to a data output line during a column scan operation.

33 Claims, 6 Drawing Sheets

PROGRAM VERIFICATION FOR NON-VOLATILE MEMORY

CROSS-REFERENCE TO RELATED APPLICATIONS

This U.S. non-provisional patent application claims priority under 35 U.S.C. §119 from Korean Patent Application 2004-116840 filed on Dec. 30, 2004, the entire contents of which are hereby incorporated by reference.

BACKGROUND

Semiconductor memories are vital components of microelectronic systems such as computers and other micro-processor based applications ranging from satellites to consumer electronics. Therefore, advances in the fabrication of semiconductor memories, including process enhancement and technology developments through the scaling for higher densities and faster speeds, help establish higher performance standards for other digital logic families.

Semiconductor memories are generally characterized as either volatile or non-volatile. In volatile memories, information is stored either by setting the logic state of a bi-stable flip-flop such as in a static random access memory (SRAM), or through the charging of a capacitor as in a dynamic random access memory (DRAM). In the either case, data are stored and can be read out as long as the power is applied, but are lost when the power is turned off.

Non-volatile memories such as mask read only memory (MROM), programmable read only memory (PROM), erasable programmable read only memory (EPROM), and electrically erasable programmable read only memory (EEPROM) are capable of storing data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvRAM) for use in systems that require fast, reprogrammable non-volatile memory. In addition, dozens of special memory architectures have evolved which contain some additional logic circuitry to optimize their performance for application-specific tasks.

Some types of non-volatile memory devices such as MROM, PROM, and EPROM are either incapable of being erased and re-written, or must be removed from the system to be erased and reprogrammed. EEPROM is electrically erasable and writable while installed in a system and has been widely used in applications requiring continuous reprogramming such as system programming or as subsidiary memory devices. One type of EEPROM know as flash EEPROM ("flash memory") is advantageously used for mass storage in subsidiary devices because its high integration density as compared with conventional EEPROM. Two common types of flash memory are NAND-type (which generally has higher integration densities) and NOR-type.

A NAND-type flash memory device includes a memory cell array region for storing information. The memory cell array is formed by a plurality of cell strings called NAND strings. A page buffer circuit is used to store data into or read data from the memory cell array in a flash memory. Memory cells in NAND-type flash memory are erased and programmed using the well-known F-N (Fowler-Nordheim) tunneling current technique. Such erasing and programming methods are disclosed in U.S. Pat. No. 5,473,563 entitled "NONVOLATILE SEMICONDUCTOR MEMORY" and U.S. Pat. No. 5,696,717 entitled "NONVOLATILE INTEGRATED CIRCUIT MEMORY DEVICES HAVING ADJUSTABLE ERASE/PROGRAM THRESHOLD VOLTAGE VERIFICATION CAPABILITY".

To store data in a memory cell array, a data loading command is first applied to a flash memory. Then, address and data are successively input to the flash memory. Data to be programmed are generally transmitted sequentially to a page buffer circuit in byte or word units. Once the page buffer circuit is full, all of the data in the page buffer circuit are simultaneously programmed into the memory cell array (in the memory cells corresponding to the selected page) in response to a program command. A cycle (also referred to as a "program cycle") in which data is programmed consists of a plurality of program loops. Each of the program loops is divided into two portions, e.g., a program portion and a program verification portion. During the program portion, the memory cells are programmed under a given bias condition in a manner well known in the art. During the program verification portion, the memory cells are accessed to verify that they have been programmed to a predetermined threshold voltage. The above-mentioned program loops are carried out repeatedly until all memory cells are verified as programmed, up to a certain maximum amount of time. During a program verification operation, data is accessed in the same manner as a normal operation, except that the read data are only used to internally verify the programming operation.

Various verification methods have been suggested in order to determine whether or not memory cells are programmed to wanted threshold voltages. One typical example is a wired-OR scheme of the type disclosed in U.S. Pat. No. 5,299,162 entitled "NONVOLATILE SEMICONDUCTOR MEMORY DEVICE AND AN OPTIMIZING PROGRAMMING METHOD THEREOF" ("the '162 patent") which is incorporated herein by reference. FIG. 1 is a block diagram showing a memory device disclosed in the '162 patent. The memory device includes a program-status detecting circuit PS, which receives data stored in latches LT of a page buffer during a program verification portion and detects whether or not input data values indicate a program data value. For example, when all selected memory cells are programmed in an optimized state, the program-status detecting circuit PS outputs a normal detecting signal. If at least one selected memory cell is insufficiently programmed, the program-status detecting circuit PS outputs an abnormal detecting signal.

In a wired-OR type program verification method, the states of the selected memory cells are simultaneously detected, so the program verification time is short. When there are physical defects (e.g., adjacent page buffers are electrically connected) in page buffers, however, the program verification operation is influenced by the defective page buffers. In other words, even though the page buffers are replaced, the output of the program-status detecting circuit PS always indicates a program fail. To overcome these problems, a column scan type program verification method (also referred to as a "Y-scan" type) has been introduced in recent years. An example of a memory device adopting a column scan type program verification method is disclosed in U.S. Pat. No. 6,282,121 entitled "FLASH MEMORY DEVICE WITH PROGRAM STATUS DETECTION CIRCUITRY AND THE METHOD THEREOF" ("the '121 patent") which is incorporated herein by reference. FIG. 2 is a block diagram showing the memory device disclosed in the '121 patent.

The memory device of FIG. 2 includes a program-status detecting circuit 190. During a program verification operation, data bits read by a page buffer circuit 110 are transmitted through a column gate circuit 140 to the program-status detecting circuit 190 in a preset unit, e.g., a byte or word unit. The program-status detecting circuit 190 detects whether all input data bits have been programmed to the correct data value. Depending on the detection result, the program-status detecting circuit 190 increments an address counter 120. Accordingly, the read data bits in the page buffer circuit 110 are not detected at the same time, and they are transmitted through a column gate circuit 140 to the program-status detecting circuit 190 in preset units. That is, the read data in the page buffer circuit 110 are scanned in preset units to verify programming.

A program verification operation using the above-described Y-scan technique accesses data in the same manner as a normal read operation except that the read data is only used internally during a program verification operation. The program cycle consists of several program loops, each including program portion and a program verification portion. As such, the entire program time is limited by the amount of time required to perform program verification operation.

SUMMARY

In one exemplary embodiment according to the inventive principles of this patent disclosure, a non-volatile memory device may include a page buffer circuit including a plurality of page buffer groups, each page buffer group having a plurality of page buffers; a plurality of data output lines, each output line coupled to the page buffers in a corresponding page buffer group; and control circuitry to control the page buffer circuit so that data from more than one of the page buffers in each page buffer group may be simultaneously represented on a corresponding data output line depending on an operation mode.

In another exemplary embodiment according to the inventive principles of this patent disclosure, a method for program verification in a non-volatile memory device may include storing states of programmed memory cells as data in page buffers arranged in page buffer groups; and simultaneously coupling data from more than one of the page buffers in each page buffer group to a corresponding data output line for each page buffer group.

In another exemplary embodiment according to the inventive principles of this patent disclosure, a non-volatile memory device may include a first group of page buffers coupled to a first data output line; and a second group of page buffers coupled to a second data output line; wherein more than one page buffer in the each page buffer group form a repair unit; and wherein data from more than one page buffer in each repair unit are simultaneously coupled to the corresponding data output line during a program verification operation.

In another exemplary embodiment according to the inventive principles of this patent disclosure, a method for program verification in a non-volatile memory device may include storing program verification data in groups of page buffers; transferring the program verification data from the groups of page buffers to corresponding data output lines by performing a column scan operation; and simultaneously transferring data from at least two page buffers in one group to a corresponding data output line during the column scan operation.

DETAILED DESCRIPTION

Preferred embodiments according to the inventive principles of this patent disclosure will be described below in more detail with reference to the accompanying drawings. The inventive principles may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
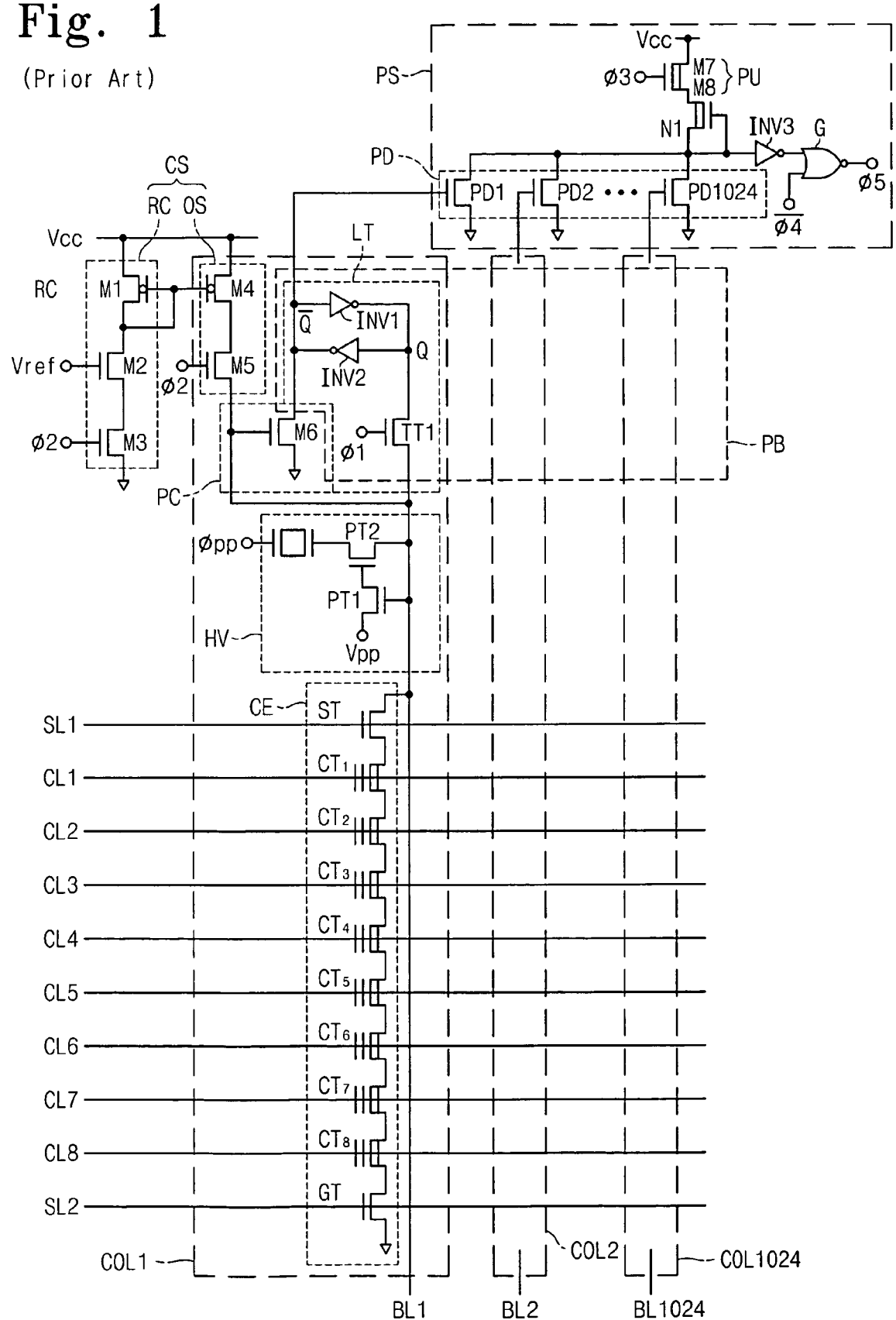
FIG. 1 is a block diagram showing memory devices adopting a wired-OR prior art program verification method.
Figure 2:
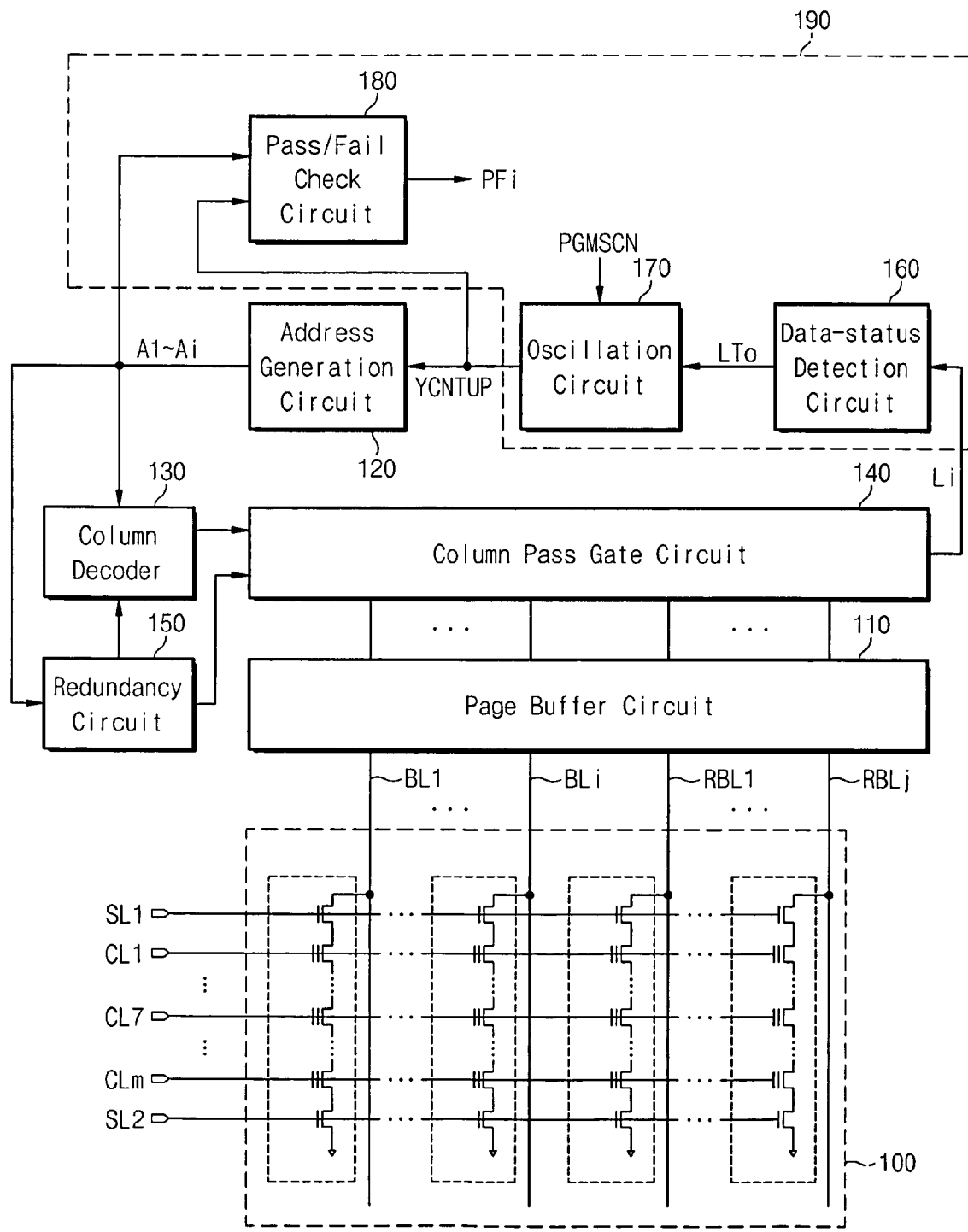
FIG. 2 is a block diagram showing memory devices adopting a prior art Y-scan type program verification method.
Figure 3:
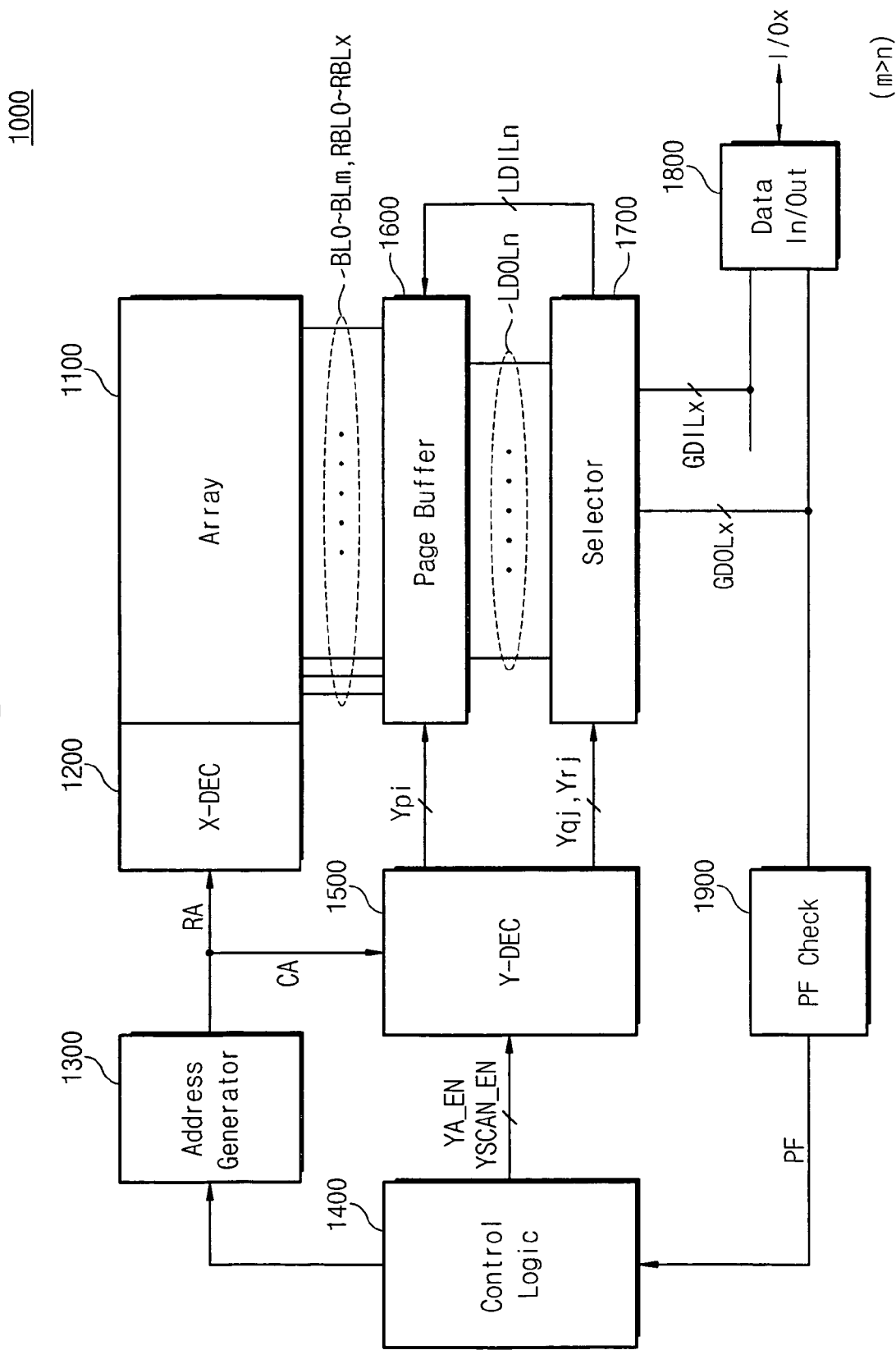
FIG. 3 is a schematic block diagram of an embodiment of a NAND-type flash memory device according to the inventive principles of this patent disclosure.

FIG. 3 is a schematic block diagram showing an embodiment of a non-volatile memory device according to the inventive principles of this patent disclosure. The embodiment of FIG. 3 is illustrated in the context of a NAND-type flash memory device. However, the inventive principles are applicable to other types of non-volatile memory.

Referring to FIG. 3, the non-volatile memory device 1000 includes a memory cell array 1100 for storing data. The memory cell array 1100 includes a plurality of cell strings, in this example NAND strings. Each of the cell strings is formed by a plurality of flash memory cells serially connected between first and second selection transistors. One of the selection transistors is a string selection transistor, while the other selection transistor is a ground selection transistor. The string and ground selection transistors are controlled by string and ground selection lines, respectively. The flash memory cells of the respective cell strings are formed by floating gate transistors. Control gates of the transistors are connected to corresponding control signals (e.g., word lines), respectively.

A row decoder circuit (denoted by "X-DEC" in FIG. 3) 1200 selects word lines according to a row address RA from an address generating circuit 1300 and applies word line voltages to a selected word line and non-selected word lines according to the respective operation modes. For example, the row selection circuit 1200 applies a program voltage to a word line that is selected during a program operation mode and a pass voltage (which is lower than the program voltage) to non-selected word lines. In addition, the row selection circuit 1200 applies a ground voltage to a word line that is selected during a read operation and a read voltage (which is lower than the pass voltage and higher than the ground voltage) to non-selected word lines. The program, pass, and read voltages are generally higher voltages than the power supply voltage, so they are generated by a high-voltage generating circuit using well-known charge pump techniques.

The address generating circuit 1300 is controlled by control logic 1400 and generates row and column addresses RA and CA. A column decoder circuit (denoted by "Y-DEC" in FIG. 3) 1500 is operated in response to control signals YSCAN_EN and YA_EN from the control logic 1400 and decodes the column address CA to create first through third selection signals Ypi, Yqj, and Yrj (where, i and j are positive integers). When the control signal YSCAN_EN is inactive, that is, during any operation other than a program verification operation (e.g., a read, program, erase operation and so forth), the column decoder circuit 1500 activates only one of the first selection signals Ypi in response to the control signal YA_EN and the column address CA. When the control signal YSCAN_EN is activated, that is, during a program verification operation, the column decoder circuit 1500 may simultaneously activate two or more of the first selection signals Ypi in response to the control signal YA_EN and the column address CA as will be described in more detail below.

Bit lines BL0-BLm and RBL0-RBLx arranged through the memory cell array 1100 are electrically connected to a page buffer circuit 1600. The page buffer circuit 1600 senses data from memory cells coupled to the selected word line through the bit lines BL0-BLm and RBL0-RBLx during read/verification operations. During a program operation, the page buffer circuit 1600 applies the power supply voltage (or a program-inhibited voltage) or a ground voltage (or program voltage) to bit lines BL0-BLm and RBL0-RBLx depending on the data to be programmed. Page buffer circuit 1600 includes page buffers corresponding to bit lines BL0-BLm and RBL0-RBLx. In some embodiments, the page buffers may share bit lines. The page buffer circuit 1600 outputs read data to local data output lines LDOLn in response to the first selection signals Ypi. A plurality of page buffers (referred to as a "page buffer group") are commonly connected to one of the respective data output lines. The page buffers in the page buffer groups are selected by the first selection signals Ypi, respectively. For instance, when one selection signal is activated, data from one page buffer in each of the page buffer groups is coupled to a corresponding local data output line. When all or some of the selection signals are activated, data from all or some of the page buffers in each page buffer group are commonly reflected in their corresponding local data output line. Since all or some of the first selection signals Ypi are activated during a program verification operation, read data values from two or more page buffers may be simultaneously reflected on one local data output line corresponding to a respective page buffer group. Also, the page buffer circuit 1600 latches data to be programmed into the memory cell array from local data input lines LDILn in response to the first selection signals Ypi.

In an example embodiment, the first selection signals Ypi are activated in pairs such as (Yp0, Yp1), (Yp2, Yp3), (Yp4, Yp5) and so forth during a program verification operation. In some embodiments of a non-volatile memory device according to according to the inventive principles of this patent disclosure, when one page buffer is determined to have a defect (or is determined to be connected to a defective bit line), the page buffer having a defect is repaired by substituting another page buffer or buffers. In this case, an adjacent page buffer as well as the page buffer having a defect is repaired by substituting two other page buffers at the same time. Thus, two page buffers comprise one repair unit in this example. Read data values of the page buffers comprising a repair unit are reflected in one local data output line at the same time during a program verify operation. Similarly, the read data values of the other page buffers arranged in repair units are also reflected simultaneously in corresponding local data output lines.

The selection circuit 1700 operates in response to the second and third selection signals (Yqj, Yrj). During a read/verification operation, the selection circuit 1700 selects local data output lines LDOLn in predetermined units (e.g., x8, x16, x32, and so forth) in response to the second and third selection signals (Yqj, Yrj) and transfers data on the selected local data output lines to corresponding global data output lines GDOLx, respectively. During a data loading operation, the selection circuit 1700 selects local data input line LDILn in response to the second and third selection signals (Yqj, Yrj) in predetermined units (e.g., x8, x16, x32, and so forth) and transfers data to be programmed from the global data input lines GDILn to the selected data input lines, respectively. The global data input lines GDILn are electrically connected to the data input/output circuit 1800 to receive data to be programmed. The global data output lines GDOLn are electrically connected to the data input/output circuit 1800 to output read data during a read operation. The pass/fail check circuit 1900 is electrically connected to the global data output lines GDOLn to receive data selected by the selection circuit 1700 during a program verification operation. The data input/output circuit 1800 is controlled by control logic 1400 to receive program input data and to output read data.

Though not shown in FIG. 3, apparatus for precharging the global data input/output lines may be provided, for example, in the data input/output circuit 1800.

The pass/fail check circuit 1900 checks whether all data on the global data output lines GDOLn have the correct value or not. If all input data values are correct, the pass/fail check circuit 1900 outputs a pass/fail signal PF indicating a program pass to control logic 1400. If any one of the input data values are incorrect, the pass/fail check circuit 1900 outputs a pass/fail signal indicating a program fail to control logic 1400. Control logic 1400 is part of the overall control circuitry including the address generating circuit 1300 and the column decoder circuit 1500. Control logic 1400 is structured to control the operation of the non-volatile memory device 1000. Control logic 1400 controls the address generating circuit 1300 and the column decoder circuit 1500 in response to the pass/fail signal PF during a program verification operation. For instance, when the pass/fail signal PF indicates a program pass, control logic 1400 controls the address generating circuit 1300 to increment the column address CA by the appropriate amount, for example 1, and at the same time, continuously activates the control signal YSCAN_EN. In other words, a Y-scan operation is performed continuously. When the pass/fail signal PF indicates a program fail, the control logic 1400 deactivates the control signal YSCAN_EN and at the same time stops the operation of the address generating circuit 1300. That is, the Y-scan operation is stopped, and then another program loop including a program operation may be performed under control of the control logic 1400. In this case, the address generating circuit 1300 is not initialized. Instead, the column address previously generated is used as the initial column address during a program verification operation of next program loop.

As described above, since multiple first selection signals Ypi are activated simultaneously, data values from at least two page buffers are simultaneously reflected in one local data output line during a program verification operation. The pass/fail check circuit 1900 detects program pass/fail on the basis of information reflected in the local data output line. Accordingly, the time required to perform a Y-scan operation may be reduced and as a result, the entire program time may be reduced.

Figure 4:
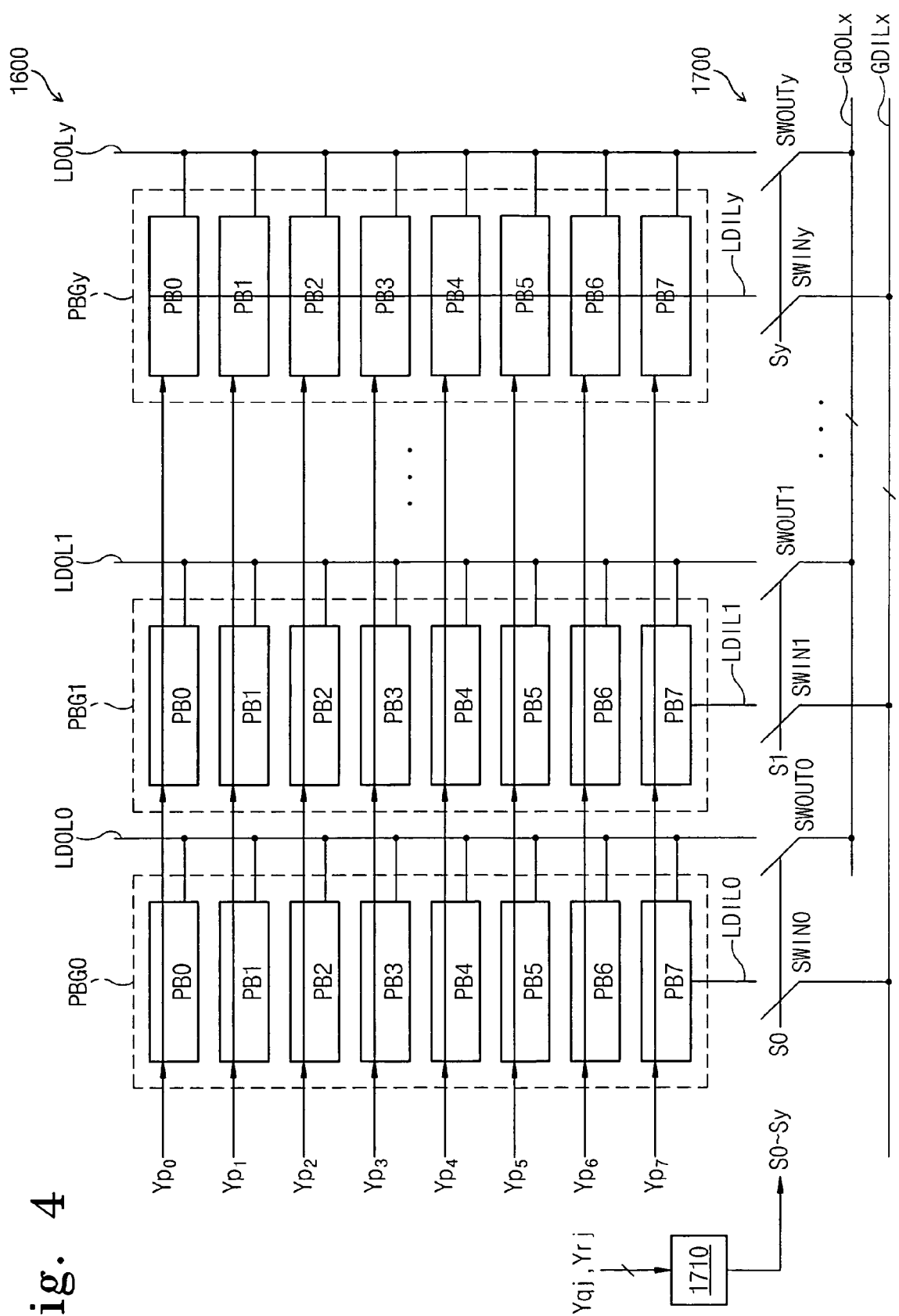
FIG. 4 is a block diagram showing an embodiment of a page buffer circuit and a selection circuit according to the inventive principles of this patent disclosure.

FIG. 4 is a block diagram showing embodiments of a page buffer circuit and a selection circuit according to the inventive principles of this patent disclosure.

With reference to FIG. 4, the page buffer circuit 1600 is formed by a plurality of page buffer groups PBG0-PBGy. Each of the page buffer groups PBG0-PBGy, for instance, is formed by eight page buffers PB0-PB7. Corresponding selection signals Yp0-Yp7 are applied to the page buffers PB0-PB7 of the respective page buffer groups. For example, the selection signal Yp0 is applied to the page buffer PB0, and the selection signal Yp1 is applied to the page buffer PB1. The number of page buffer groups PBG0-PBGy is equal to that of local data output lines LDOL0-LDOLy. The page buffers of a page buffer group are commonly connected to a corresponding local data output line. For example, page buffers PB0-PB7 of page buffer group PBG0 are commonly connected to the local data output line LDOL0. Page buffers PB0-PB7 of the page buffer group PBG1 are commonly connected to the local data output line LDOL1. When one (e.g., Yp0) of the selection signals Yp0-Yp7 is activated, the page buffers PB0 of page buffer groups PBG0-PBGy in which the activated selection signal Yp0 is applied output data values to corresponding local data output lines LDOL0-LDOLy.

The page buffer groups PBG0-PBGy are also connected to local data input lines LDIL0-LDILy, respectively. A local data input line is commonly connected to the page buffers of a corresponding page buffer group. For instance, page buffers PB0-PB7 of the page buffer group PBG0 are commonly connected to the local data input line LDIL0. When one (e.g., Yp0) of the selection signals Yp0-Yp7 is activated, data values to be programmed on corresponding local data input lines LDIL0-LDILy are transferred to the page buffers PB0 of the page buffer groups PBG0-PBGy in which the activated selection signal Yp0 is applied, respectively. Each of the local data input lines LDIL0-LDILy may form a differential pair so as to transfer complementary data signals, but only one local data input line is shown for convenience. Similarly, to prevent obscuring the drawing only the last data input line LDILy in FIG. 4 is shown connected to all of the page buffers PB0-PB7 in page buffer group PBGy, but the other data input lines are understood to be coupled to all of the page buffers in their respective groups.

With reference to FIG. 4, the selection circuit 1700 includes a decoder 1710, input switches SWIN0-SWINy, and output switches SWOUT0-SWOUTy. The decoder 1710 decodes the selection signals (Yqj, Yrj) to generate switch control signals S0-Sy. The switch control signals S0-Sy are activated to turn on input/output switches in predetermined units, e.g., x8, x16, and x32. During a data loading operation in program mode, the input switches SWIN0-SWINy select the local data input lines LDIL0-LDILy in response to corresponding switch control signals and selectively transfer data to be programmed from the global data input lines GDILx to the input lines. During a read/verification operation, the output switches SWOUT0-SWOUTy selectively connect the global data output lines GDOLx to the local data output lines LDOL0-LDOLy in response to corresponding switch control signals.

Figure 5:
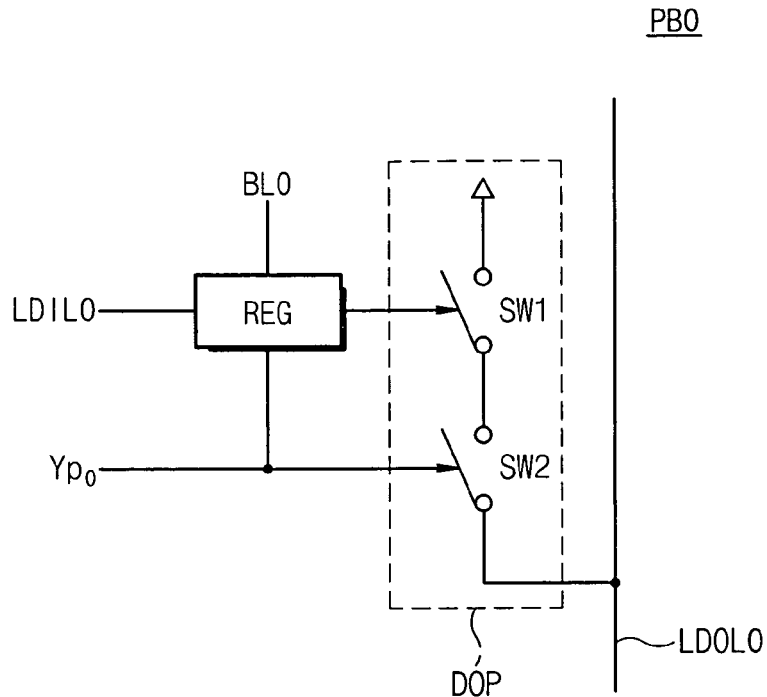
FIG. 5 is a circuit diagram showing an embodiment of a page buffer according to the inventive principles of this patent disclosure.

FIG. 5 is a circuit diagram showing an embodiment of a page buffer according to the inventive principles of this patent disclosure.

The page buffer of FIG. 5 corresponds to one of page buffers of the page buffer circuit 1600, and the rest of the page buffers may be substantially the same as the page buffers of FIG. 5. The page buffer PB0 includes a register REG and a data output unit DOP. The register REG is structured to latch data from the local data input line LDIL0 in response to the selection signal Yp0 during a program operation. In addition, the register REG is structured to latch data from a memory cell through a bit line BL0 during a read operation. During a read operation, the data output unit DOP grounds the data output line LDOL0 according to the value stored in the register REG in conjunction with the selection signal Yp0. The data output unit DOP includes a first switch SW1 and a second switch SW2. The first switch SW1 is controlled by the value stored in the register REG, and the second switch SW2 is controlled by the selection signal Yp0.

During a read/verification operation, if the selected memory cell is an off-cell (a programmed cell), the register REG is structured to output a logic low level. In other words, if the selected memory cell is an off-cell (a programmed cell), the first switch SW1 of the data output unit DOP is turned off. In contrast, if the selected memory cell is an on-cell (an erased cell), the register REG is structured to output a logic high level. That is, if the selected memory cell is an on-cell, the first switch SW1 of the data output unit DOP is turned on.

Data to be programmed is transferred to the register REG through the following process. The data to be programmed is transferred to the local data input line (e.g., LDIL0) through the data input/output circuit 1800 and the selection circuit 1700. If the data is "0", the local data input line LDIL0 is low. If the data to be programmed is "1", the local data input line LDIL0 is high. When the selection signal Yp0 is activated (driven to logic high), data on the local data input line LDIL0 is loaded into the register REG. During a program operation, the bit line BL0 is set to a power supply voltage or a ground voltage according to data loaded to the register REG, and the selected memory cell of a cell string connected to the bit line BL0 is programmed in a well-known manner.

The state of the programmed memory cell is read and transferred to the register REG as follows. The register REG senses the state of the selected memory cell through the bit line BL0 and stores the sensed state temporarily. If the selected memory cell is an off-cell (a programmed cell), the register REG outputs a low-level signal to the first switch SW1. Even though the selection signal Yp0 is activated, the local data output line LDOL0 is in a precharge state, e.g., logic high level. This is because the first switch SW1 is turned off. If the selected memory cell is an on-cell (an erased cell), the register REG outputs a high-level signal to the first switch SW1. When the selected signal Yp0 is activated, the first switch SW1 is turned on, so that the local data output line LDOL0 is grounded by the turned-on switches SW1 and SW2. Data on the local output line LDOL0 is transferred to the pass/fail check circuit 1900 through the selection circuit 1700.

Figure 6:
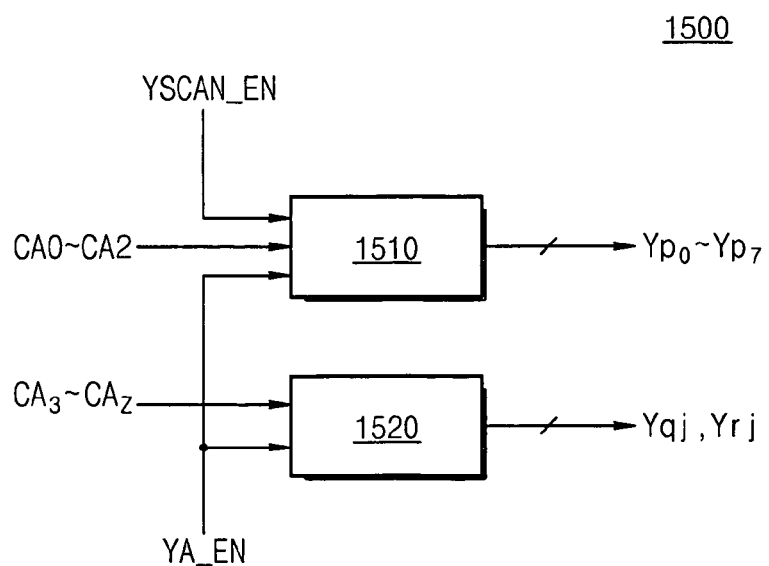
FIG. 6 is a circuit diagram showing an embodiment of a column decoder according to the inventive principles of this patent disclosure.

FIG. 6 is a circuit diagram showing an embodiment of a column decoder circuit according to the inventive principles of this patent disclosure.

With reference to FIG. 6, the column decoder circuit 1500 includes a first decoder 1510 and a second decoder 1520. The first decoder 1510 decodes first column addresses CA0-CA2 in response to control signals YSCAN_EN and YA_EN, and depending on the decoding result, generates the first selection signals Yp0-Yp7. The second decoder 1520 decodes second column addresses CA3-CAz in response to control signals YA_EN and YA_EN, and depending on a decoding result, generates the second and third selection signals (Yqj, Yrj). The first decoder 1510 decodes column address signals CA1 and CA2 to activate the first selection signals Yp0-Yp7 irrespective of the column address signal CA0 when the control signal YSCAN_EN is activated to logic high. This means that two selection signals are simultaneously activated in response to the column address signals during the activation of the control signal YSCAN_EN.

In FIG. 6, the first decoder 1510 is constructed so that two selection signals are activated simultaneously, but any other number of selection signals (e.g., four or all selection signals) may be activated at the same time.

Figure 7:
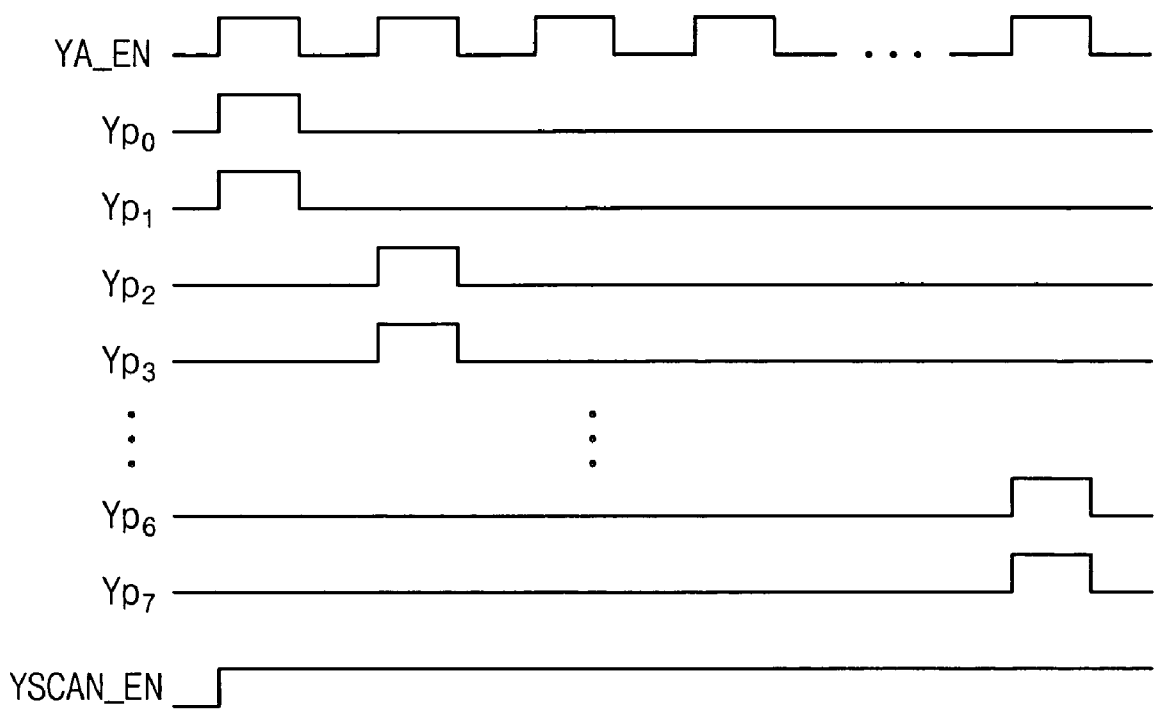
FIG. 7 is a timing diagram illustrating an embodiment of a program verification operation of a non-volatile memory device according to the inventive principles of this patent disclosure.

FIG. 7 is a timing diagram illustrating an embodiment of a program verification operation for non-volatile memory device according to the inventive principles of this patent disclosure. When the non-volatile memory device enters a program operation mode, the address generating circuit 1300 sequentially generates column addresses according to an input column address under control of control logic 1400. The column decoder circuit 1500 generates the first to third selection signals (Ypi, Yqi, Yrj) in response to a generated column address. At this time, since the control signal YSCAN_EN is not activated, only one of the first selection signal Yp0-Yp7 is activated. That is, only one of the page buffers PB0-PB7 in each page buffer group is selected. The selection circuit 1700 selects some of the local data input lines in response to the second and third selection signals (Yqj, Yrj). In this case, data to be programmed is transferred to global data input lines GDILx through the data input/output circuit 1800. Data bits to be programmed are transferred to local data input lines selected by the selection circuit 1700. The data bits to be programmed are loaded into corresponding page buffers which are connected to the selected local data input lines and receive the activated first selection signal. Through this processes, data bits to be programmed are loaded into the page buffer circuit 1600.

As a word line is selected according to an input row address, and bit lines are driven with the power supply voltage or a ground voltage according to loaded data bits, memory cells coupled to the selected word line are programmed during a pre-set program loop time. Once the program operation of a first program loop is performed, a program verification operation is performed to determine whether the threshold voltages of the programmed memory cells have reached the required threshold voltage. In order to measure the threshold voltages, the selected memory cells are read and their states are stored in the registers REG of the page buffer circuit 1600 in the same manner as described above. After the states of the selected memory cells are stored in the page buffer circuit 1600, control logic 1400 activates the control signal YSCAN_EN indicating the start of a Y-scan operation. Next, the data values stored in the page buffer circuit 1600 are sequentially transferred to the pass/fail check circuit 1900 using a Y-scan technique. At the same time, the address generating circuit 1300 generates the column address CA under the control of control logic 1400.

The column decoder circuit 1500 decodes an input column address in response to control signals YA_EN and YSCAN_EN. The first to third selection signals (Ypi, Yqj, Yrj) are generated in response to the decoding result. Specifically, since the control signal YSCAN_EN is activated, the first decoder 1510 of the column decoder 1500 activates two selection signals (Yp0, Yp1) at the same time. In other words, since two selection signals (Yp0, Yp1) are activated at the same time, data values of two page buffers PB0 and PB1 in each of the page buffer groups are simultaneously reflected in a corresponding local data output line. For example, if data values latched into the page buffers PB0 and PB1 of the respective page buffer groups are at low logic levels indicating all program pass, the first switch SW1 of the data output unit DOP in each of the respective page buffers is turned off. As a result, the corresponding local data output line remains at the high level (the precharge level) indicating a program pass. In contrast, if at least one of the data values latched into the page buffers PB0 and PB1 of the respective page buffer groups is high, the first switch SW1 of the data output unit DOP of that page buffer is turned on. As a result, a local data output line goes low indicating a program fail.

The logic levels of the local data output lines are transferred to the global data output lines by the selection circuit 1700. The pass/fail check circuit 1900 detects whether the memory cells of the present generated column address are programmed to the required threshold voltage in response to the logic levels of the global data output lines. If the memory cells are programmed to the required threshold voltage, control logic 1400 causes the address generating circuit 1300 to generate the next column address in response to the pass/fail signal PF. The next Y-scan operation will then be carried out in the same manner as mentioned above. Otherwise, control logic 1400 deactivates the control signals YA_EN and YSCAN_EN in response to the pass/fail signal PF so as to end the present program verification operation. The next program loop will then repeat the program/verify cycle in the same manner.

As described above, data values of at least two or more page buffers may be reflected in one local data output line simultaneously during a program verification operation. As a result, the time for performing a Y-scan operation may be reduced, and thus, the entire program time may be reduced.

Although the present invention has been described in the context of preferred embodiments, the inventive principles of this patent disclosure are not limited thereto. It will be apparent to those skilled in the art that various substitution, modifications and changes may be thereto without departing from the inventive principles.

The invention claimed is:

1. A non-volatile memory device comprising:
a page buffer circuit including a plurality of page buffer groups, each page buffer group having a plurality of page buffers;
a plurality of data output lines, each data output line coupled to the page buffers in a corresponding page buffer group; and
control circuitry to control the page buffer circuit so that data from more than one of the page buffers in each page buffer group may be simultaneously represented on a corresponding data output line depending on an operation mode;
wherein the control circuitry comprises a decoder circuit to simultaneously activate more than one but less than all of the page buffers in each page buffer group in response to a first column address depending on the operation mode.

2. The non-volatile memory device as set forth in claim 1, wherein the control circuitry may control the page buffer circuit so that data from more than one of the page buffers in each page buffer group may be simultaneously represented on a corresponding data output line during a program verification operation.

3. The non-volatile memory device as set forth in claim 1, wherein the control circuitry may control the page buffer circuit so that data from more than one of the page buffers forming a repair unit in a page buffer group may be simultaneously represented on a corresponding data output line during a program verification operation.

4. The non-volatile memory device as set forth in claim 1, wherein the control circuitry may control the page buffer circuit so that data from one of the page buffers in each page buffer group is represented on a corresponding data output line during a read operation.

5. The non-volatile memory device as set forth in claim 1, further comprising:
   a selection circuit to select the data output lines in a predetermined unit; and
   a pass/fail check circuit to receive the data from the selected data output lines during a program verification operation to determine program pass or fail.

6. The non-volatile memory device as set forth in claim 5, wherein the control circuitry is structured to control the program verification operation in response to an output of the pass/fail check circuit.

7. The non-volatile memory device as set forth in claim 5, further comprising a plurality of data input lines coupled to corresponding page buffer groups.

8. The non-volatile memory device as set forth in claim 7, wherein the selection circuit may select the data input lines in a predetermined unit during a data loading operation and transfer data to be programmed onto the selected data input lines.

9. The non-volatile memory device as set forth in claim 8, wherein the control circuitry may control the page buffer circuit so as to latch the transmitted data values to be programmed.

10. The non-volatile memory device as set forth in claim 1, wherein:
    the page buffers in each page buffer group operate in response to a first selection signal from the decoder circuit; and
    data from more than one but less than all of the page buffers of each of the page buffer groups are simultaneously represented in corresponding data output lines when some of the first selection signals are activated simultaneously.

11. The non-volatile memory device as set forth in claim 10, wherein the control circuitry comprises control logic structured to control a program verification operation.

12. The non-volatile memory device as set forth in claim 11, further comprising:
    a selection circuit to select the data output lines in a predetermined unit; and
    a pass/fail check circuit to receive the data from the selected data output lines during the program verification operation to determine program pass or fail.

13. The non-volatile memory device as set forth in claim 12, wherein the decoder circuit generates second selection signals in response to a second column address.

14. The non-volatile memory device as set forth in claim 13, wherein the selection circuit selects data input lines coupled to corresponding page buffer groups by a predetermined unit in response to the second selection signals during a data loading operation and transfers data to be programmed onto the selected data input lines.

15. The non-volatile memory device as set forth in claim 14, wherein the data to be programmed are stored in corresponding page buffer groups in response to the first and second selection signals.

16. The non-volatile memory device as set forth in claim 12, further comprising an address generating circuit to generate the column address.

17. The non-volatile memory device as set forth in claim 1, wherein each page buffer comprises:
    a register structured to store data; and
    a data output unit structured to drive a corresponding data output line according data stored in the register when a corresponding first selection signal is activated.

18. The non-volatile memory device as set forth in claim 17, wherein:
    each register is structured to output a first logic level to a corresponding data output unit when a corresponding memory cell is a programmed cell; and
    each register is structured to output a second logic level to a corresponding data output unit when a corresponding memory cell is an erased cell.

19. The non-volatile memory device as set forth in claim 17, wherein each data output unit comprises:
    a first switch arranged to be controlled by the corresponding register; and
    a second switch coupled in series with the first switch and arranged to be controlled in response to the corresponding first selection signal.

20. A method for program verification in a non-volatile memory device comprising:
    storing states of programmed memory cells as data in page buffers arranged in page buffer groups; and
    simultaneously coupling data from more than one but less than all of the page buffers in each page buffer group to a corresponding data output line for each page buffer group.

21. The method as set forth in claim 20, wherein the data in a first page buffer in each page buffer group is coupled to the corresponding data output line in response to a first selection signal.

22. The method as set forth in claim 21, wherein the data in a second page buffer in each page buffer group is coupled to the corresponding data output line in response to a second selection signal.

23. The method as set forth in claim 22, wherein the first and second selection signals are activated simultaneously in response to a scan enable signal and column address information.

24. The method as set forth in claim 21, wherein more than one of the page buffers in each page buffer group form a repair unit.

25. A non-volatile memory device comprising:
    a first group of page buffers coupled to a first data output line; and
    a second group of page buffers coupled to a second data output line;
    wherein more than one page buffer in the each page buffer group form a repair unit; and
    a decoder circuit to couple data from more than one but less than all of the page buffers in each repair unit simultaneously to the corresponding data output line during a program verification operation.

26. The non-volatile memory device as set forth in claim 25, wherein data are transferred from the page buffers to the corresponding data output lines in response to selection signals.

27. The non-volatile memory device as set forth in claim 26, wherein each selection signal is coupled to page buffers in more than one group.

28. The non-volatile memory device as set forth in claim 27, wherein the selection signals are generated in response to a scan enable signal and column address information.

29. A non-volatile memory device comprising:
    a page buffer circuit including a plurality of page buffer groups, each page buffer group having a plurality of page buffers;

a plurality of data output lines, each data output line coupled to the page buffers in a corresponding page buffer group; and control circuitry to control the page buffer circuit so that data from more than one but less than all of the page buffers in each page buffer group may be simultaneously represented on a corresponding data output line depending on an operation mode, wherein the control circuitry comprises:

control logic structured to control a program verification operation;

a selection circuit to select the data output lines in a predetermined unit;

a pass/fail check circuit to receive the data from the selected data output lines during the program verification operation to determine program pass or fail, wherein the decoder circuit generates selection signals in response to a column address, wherein the selection circuit selects data input lines coupled to corresponding page buffer groups by a predetermined unit in response to the selection signals during a data loading operation and transfers data to be programmed onto the selected data input lines.

30. A method for program verification in a non-volatile memory device comprising:

storing program verification data in groups of page buffers;

transferring the program verification data from the groups of page buffers to corresponding data output lines by performing a column scan operation; and simultaneously transferring data from at least two but less than all page buffers in one group to a corresponding data output line during the column scan operation.

31. The method as set forth in claim 30, wherein the scan operation is performed by sequentially activating select signals in response to column address information.

32. The method as set forth in claim 31, wherein the select signals are activated at least two at a time during the column scan operation.

33. The method as set forth in claim 32, wherein the page buffers that receive simultaneously activated selection signals in a group form a repair unit.

* * * * *